US010734284B2

(12) United States Patent
Chang et al.

(10) Patent No.: US 10,734,284 B2
(45) Date of Patent: Aug. 4, 2020

(54) METHOD OF SELF-ALIGNED DOUBLE PATTERNING

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Ying-Chih Lin, Tainan (TW); Gang-Yi Lin, Taitung County (TW); Chieh-Te Chen, Kaohsiung (TW); Yi-Ching Chang, Pingtung County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/134,976

(22) Filed: Sep. 19, 2018

(65) Prior Publication Data

US 2019/0139824 A1     May 9, 2019

(30) Foreign Application Priority Data

Nov. 7, 2017 (CN) .......................... 2017 1 1082701

(51) Int. Cl.
*H01L 21/033* (2006.01)
*H01L 21/768* (2006.01)
(Continued)

(52) U.S. Cl.
CPC .... *H01L 21/76897* (2013.01); *H01L 21/0337* (2013.01); *H01L 21/28123* (2013.01);
(Continued)

(58) Field of Classification Search
CPC .......... H01L 21/0337; H01L 21/28123; H01L 21/3086; H01L 21/32139; H01L 21/76897; H01L 21/02186; H01L 21/31116
(Continued)

(56) References Cited

U.S. PATENT DOCUMENTS 6,638,441 B2   10/2003  Chang
6,924,191 B2    8/2005  Liu
(Continued)

FOREIGN PATENT DOCUMENTS

CN    103117243 A    5/2013
CN    104658980 A    5/2015

OTHER PUBLICATIONS

Chang, Title of Invention: Manufacturing Method for Forming a Semiconductor Structure , U.S. Appl. No. 15/725,258, filed Oct. 4, 2017.

*Primary Examiner* — Lan Vinh
(74) *Attorney, Agent, or Firm* — Winston Hsu (57) ABSTRACT

A method of self-aligned double patterning is disclosed in the present invention, which includes the step of forming multiple mandrels on a hard mask layer and spacers at two sides of each mandrel, forming a protection layer filling between the spacers, removing the mandrels to expose the hard mask layer, and performing an anisotropic etch process using the spacers and the protection layer as an etch mask to remove a portion of hard mask layer, so that a thickness of hard mask layer exposed between the spacers equals to a thickness of hard mask layer under the protection layer.

7 Claims, 6 Drawing Sheets

(51) Int. Cl.
*H01L 21/308* (2006.01)
*H01L 21/28* (2006.01)
*H01L 21/3213* (2006.01)
*H01L 21/311* (2006.01)

(52) U.S. Cl.
CPC .... *H01L 21/3086* (2013.01); *H01L 21/32139* (2013.01); *H01L 21/31116* (2013.01)

(58) Field of Classification Search
USPC .... 438/689.7, 710, 714, 717, 719, 723, 736, 438/737, 689, 700, 712
See application file for complete search history.

(56) References Cited

U.S. PATENT DOCUMENTS

| | | | |
|---|---|---|---|
| 8,278,221 B2 * | 10/2012 | Koh | H01L 21/0337 438/700 |
| 8,728,906 B2 * | 5/2014 | Chang | H01L 21/02639 438/429 |
| 8,835,321 B2 | 9/2014 | Ha | |
| 9,099,403 B2 | 8/2015 | Kim | |
| 9,461,051 B2 | 10/2016 | Park | |
| 2006/0263699 A1 | 11/2006 | Abatchev | |
| 2007/0048674 A1 | 3/2007 | Wells | |
| 2014/0110817 A1 | 4/2014 | Bergendahl | |
| 2015/0040077 A1 * | 2/2015 | Ho | G03F 7/70433 716/51 |
| 2015/0255605 A1 * | 9/2015 | Loubet | H01L 29/7848 257/192 |
| 2016/0365425 A1 * | 12/2016 | Chen | H01L 29/6653 |
| 2017/0316939 A1 * | 11/2017 | deVilliers | H01L 21/0332 |

* cited by examiner

METHOD OF SELF-ALIGNED DOUBLE PATTERNING

BACKGROUND OF THE INVENTION

1. Field of the Invention

The present invention generally relates to a method of self-aligned double patterning (SADP), and more specifically, to a method of self-aligned double patterning suitable for cross SADP process.

2. Description of the Prior Art

With semiconductor devices scaling down, the Critical Dimension (CD) of photolithography is beyond the limit of optical lithography, which brings great challenges to semiconductor manufacturing industry, especially to photolithography technology. Extreme ultraviolet (EUV) lithography has higher photolithographic resolution, but for some reason it does not appear to be ready in practice and mass production. Therefore, further research and development is required in the field of optical lithography in the coming several years. Other technology, for example, Resolution Enhancement Technology (RET), Phase-Shift Mask (PSM) technology, various illumination techniques and Optical Proximity Correction (OPC) technology, etc, may also further extend the application of dry lithography. In addition, by placing an immersion fluid with high refractive index between the exposure tool lens and the resist-coated wafer, Immersion lithography can achieve higher Numerical Aperture (NA) as well as higher resolution, thus has promoted the development of photolithography.

In the progress of photolithography, double patterning (DP) technology is a potential way to enhance the lithography resolution without the need to change the tool infrastructure. The basic idea of double patterning is to separate one photomask into two complementary ones, and to form one photo layer through two separate exposure steps using the two different photomasks. In this way, higher lithography resolution is achieved compared with traditional single exposure method, and the service life of the lithography tools is also greatly extended. Therefore, the double patterning technology is widely used in current semiconductor process. There are several types of double patterning including Litho-Etch-Litho-Etch (LELE) double patterning, Litho-Freeze-Litho-Etch (LFLE) double patterning, Self-Aligned Double Patterning (SADP) and other improved solutions. For Self-Aligned-Double-Patterning technology, a spacer is formed by deposition or reaction of the film on the previous pattern, followed by etching to remove all the film material on the horizontal surfaces, leaving only the material on the sidewalls of preformed patterned feature. The original patterned feature is then removed and the pattern of spacer is transferred to the underlying material layer, thereby obtaining the pattern with smaller critical dimension. Since there are two spacers for every line, the line density would be doubled compared to the original photolithographic pattern.

The self-aligned double patterning method is usually used to form line patterns. However, in certain processes such as the process of manufacturing the contact pad for a storage node in memory devices, the contact pad is more like a dot pattern rather than a line pattern. These dot patterns cannot be formed through only one-time self-aligned double patterning process. For this reason, the current approach is to adopt the cross SADP method, wherein two self-aligned double patterning processes will be conducted to define overlapped patterns and form the dot pattern.

However, in the cross SADP process, the later second SADP process may be easily influenced by the process variation of previous first SADP process, so that final dot patterns may suffer pattern loss issues. For example, the hard mask layer in the first SADP process may have non-uniform thickness after an etch process due to the loading effect in the etch process or due to different etch selectivity for different material layers, thereby causing the pattern distortion resulted from the etch process used with this hard mask layer and affecting the finally-defined stacked patterns. Therefore, a novel process is still required and should be developed to solve these problems in the semiconductor industry.

SUMMARY OF THE INVENTION

In the light of above-described issue easily happening in cross SADP process, a novel process is provided in the present invention featuring an additional protection layer formed in the process to protect the hard mask layer in specific regions without being influenced by etch processes, so that the thickness of entire hard mask layer may remain uniform in later processes.

The aspect of present invention is to provide a method of self-aligned double patterning. The method includes the steps of forming a hard mask layer on a substrate, forming multiple mandrels on the hard mask layer and forming spacers at two sides of each mandrel, wherein the mandrels extend in a first direction and first trenches are formed between the spacers, forming a protection layer filling up the first trenches, removing the mandrels to form second trenches exposing the hard mask layer between the spacers, and performing a first anisotropic etch process using the spacers and the protection layer as an etch mask to remove a portion of hard mask layer exposed from the second trenches, so that a thickness of the hard mask layer exposed between the spacers equals to a thickness of the hard mask layer under the protection layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Before describing the preferred embodiment in more detail, further explanation shall be given regarding certain terms that may be used throughout the descriptions. For example, the term "etch" or "etching" is used herein to generally describe a fabrication process of patterning a material, such that at least a portion of the material would remain after the etch is completed. For example, it should be understood that the process of etching silicon involves the steps of patterning a photoresist above the silicon, and then removing the areas of silicon no longer protected by the masking layer. As such, the areas of silicon protected by the mask would remain behind after the etch process is complete. However, in another example, "etching" may also refer to a process that does not use a photoresist, but still leaves behind at least a portion of the material after the etch process is complete.

The above description serves to distinguish the term "etching" from "removing." When etching a material, at least a portion of the material remains behind after the process is completed. In contrast, when removing a material, all of the material is substantially removed in the process. However, in some embodiments, "removing" is considered to be a broad term that may incorporate etching.

The "substrate", "semiconductor substrate" or "chip" used throughout the descriptions is most commonly thought to be silicon substrate or silicon chip. However, the "substrate" or the "chip" may also be any of a wide array of semiconductor materials such as germanium, gallium arsenide, indium phosphide and etc. In other embodiments, the "substrate" or the "chip" may be electrically non-conductive such as a glass or sapphire wafer.

In the drawings of present invention, FIGS. 1-9 are schematic cross-sections sequentially illustrating a process flow of self-aligned double patterning (SADP) method at different steps in accordance with the embodiment of present invention. The connections between components and layer structures and their layout in the view of semiconductor plane are clearly shown in the figures.

Figure 1:
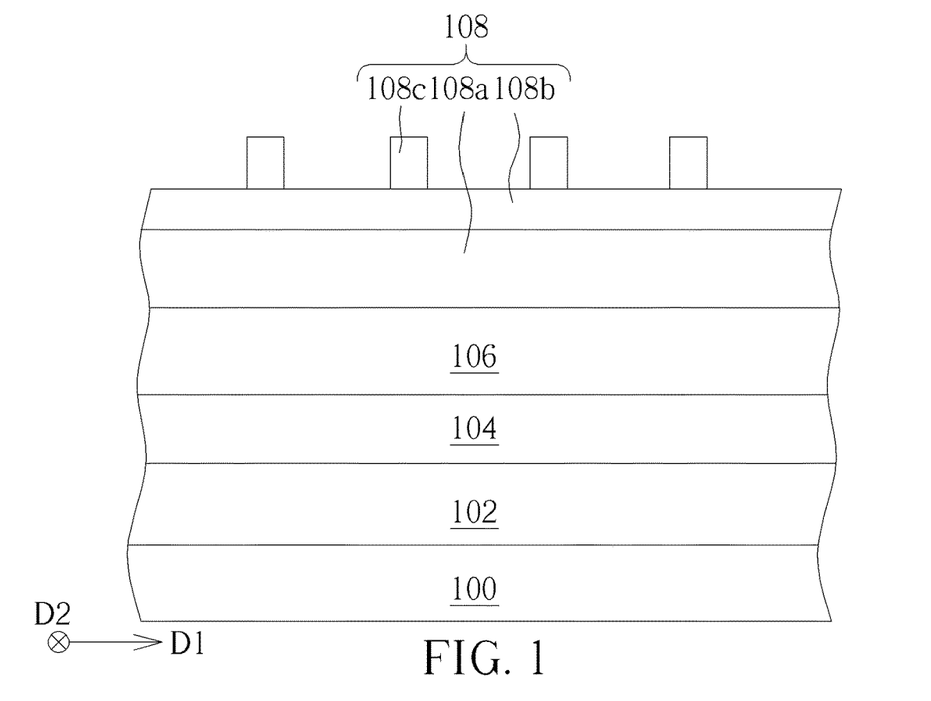
FIGS. 1-9 are schematic cross-sections illustrating every step in the method of self-aligned double patterning in accordance with the embodiment of the present invention.

Please refer to FIG. 1 first, which is a schematic cross-section of a layer structure in the beginning of SADP method in the present invention. An etch target layer 100, such as a poly-silicon layer, is first provided in the beginning of the process. In the preferred embodiment of present invention, the etch target layer 100 may be deposited over the structures like word lines, bit lines, source/drain, storage node contact plug and material layers for storage node contact pads in a memory process. In this regard, since the method and structure of present invention is not focused on the memory process before the formation of storage node contact pads, detailed description of processes before the formation of storage node contact pads will not be provided herein in case of obscuring the key features of present invention and complicating the drawings.

A first hard mask layer 102, such as a silicon nitride layer, is formed on the etch target layer 100. In the embodiment of present invention, the first hard mask layer 106 will be a layer structure to be patterned by the cross SADP process. Through the patterning of first hard mask layer 102 beforehand into desired pattern, such as the pattern of storage node contact pads, it may be used as an etch mask in a later process to pattern the underlying etch target layer 100 into final target patterns. Please note that the first hard mask layer 102 shown in FIG. 1 has been processed by a first SADP process and is provided with predetermined pattern features. As shown in the top view of FIG. 11, the first hard mask layer 102 includes multiple parallel line patterns spaced apart from each other and extending in a first direction D1 on the surface of etch target layer 100. FIG. 1 is a cross-section taken along the section line A-A' in FIG. 11. Since the first SADP process in the embodiment of present invention is conventional skills long-used in semiconductor industry, to simplify the description of unnecessary processes and focus on the essential processes of the present invention, no details relevant to this process will be addressed herein.

Refer still to FIG. 1. A flat layer 104, such as an organic dielectric layer (ODL), is formed on the first hard mask layer 102 to provide a flat surface for a following second SADP process. A second hard mask layer 106 is formed on the surface of flat layer 104 with a material identical to the one of first hard mask layer 102, such as a silicon nitride layer with a thickness about 400 Å. The second hard mask layer 106 is the main layer structure to be patterned in the second SADP process in the embodiment of present invention. Unlike the first hard mask layer 102, the second hard mask layer 106 in FIG. 1 is not patterned yet, so it is not provided with any pattern features. After the second hard mask layer 106 is formed, a composite mask structure 108 is then formed on the second hard mask layer 106, including an organic dielectric layer (ODL) 108a, a dielectric anti-reflection coating (DARC) 108b and a photoresist 108c from bottom up. The thickness of organic dielectric layer 108a and dielectric anti-reflection coating 108b are about 100 nm and 20 nm respectively, wherein multiple line patterns are defined beforehand in the photoresist 108c by a photolithographic process. These defined line patterns are mandrel patterns to be used in following second SADP process. In the embodiment of present invention, preferably, those line patterns extend in a second direction D2 (the direction into or out of paper) perpendicular to the first direction D1.

Figure 2:
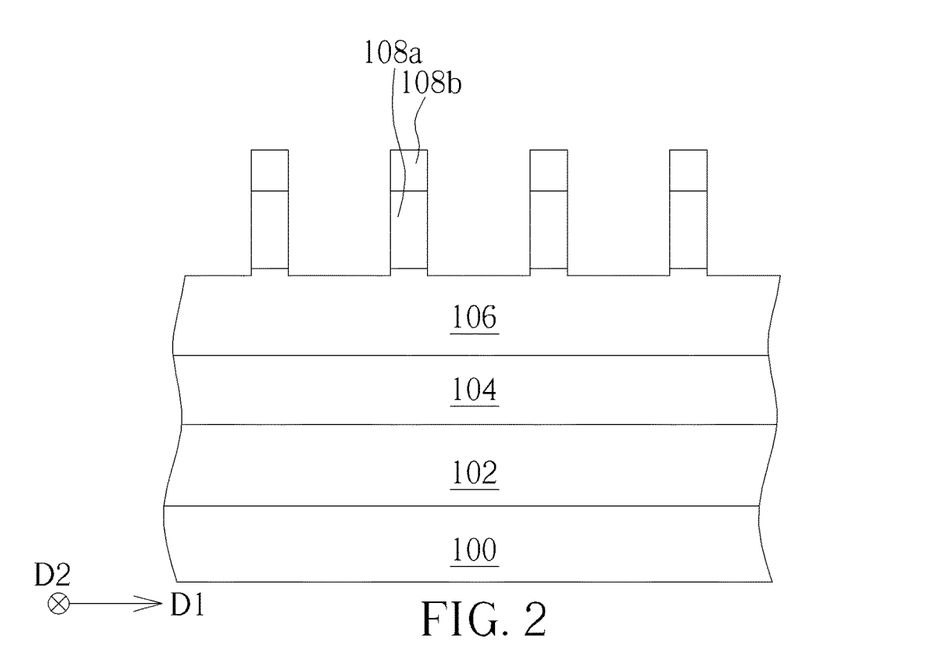

Please refer next to FIG. 2. After the above-described tri-layered composite mask structure 108 is formed, the line patterns of photoresist 108c are transferred into the underlying dielectric anti-reflection coating 108b and organic dielectric layer 108a, and the photoresist 108c is then removed. In this way, the dielectric anti-reflection coating 108b and the organic dielectric layer 108a would collectively constitute the mandrel structure in the embodiment of present invention. Please note that a small portion of second hard mask layer 106 is removed in this step, so that its thickness is thinned by about 30 Å.

Figure 3:
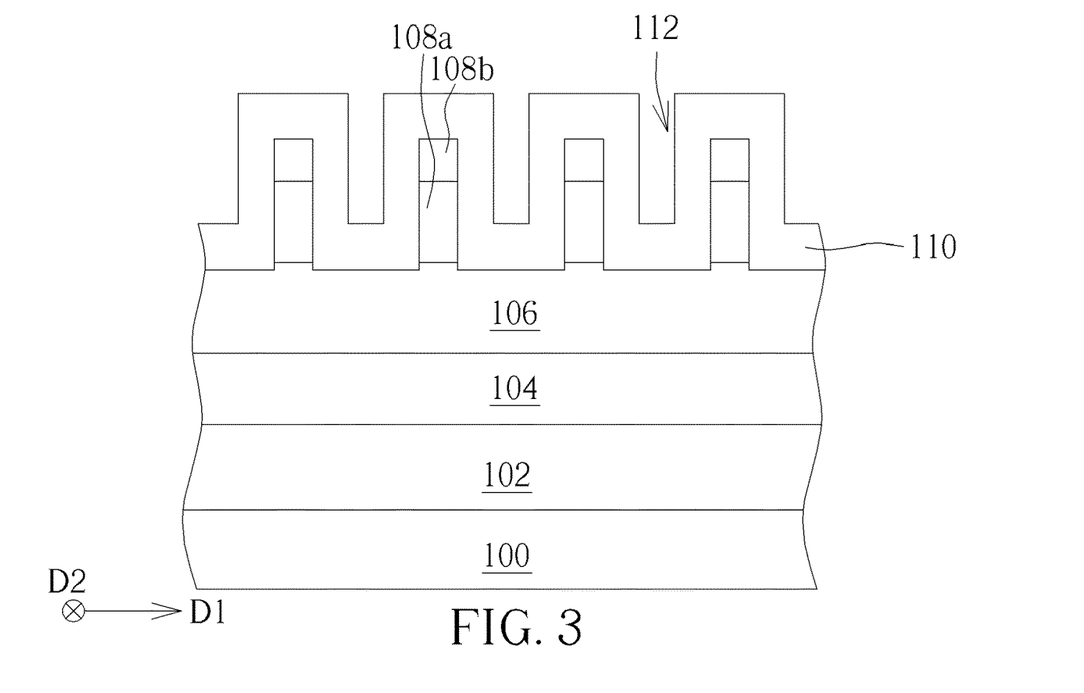

As shown in FIG. 3, after the mandrels 108a/108b are formed, a conformal spacer layer (ex. a silicon oxide layer) 110 is formed on the entire surface with a thickness about 250 Å-300 Å by atomic layer deposition (ALD), which may achieve precise thickness control. The spacer layer 110 would uniformly cover on the surface of second hard mask layer 106 and the mandrels 108a/108b, and more specifically, the thickness of spacer layer 110 would be adjusted to a value that multiple first trenches 112 are formed therebetween with a width about 250 Å-300 Å, approximating to the width of mandrel structure. The spacer layer 110 will be transformed into spacers to be used in later SADP process. In the embodiment of present invention, the region distributed with the mandrels 108a/108b is referred as mandrel region and the region distributed with the first trenches 111 is referred as non-mandrel region to facilitate the following description.

Figure 4:
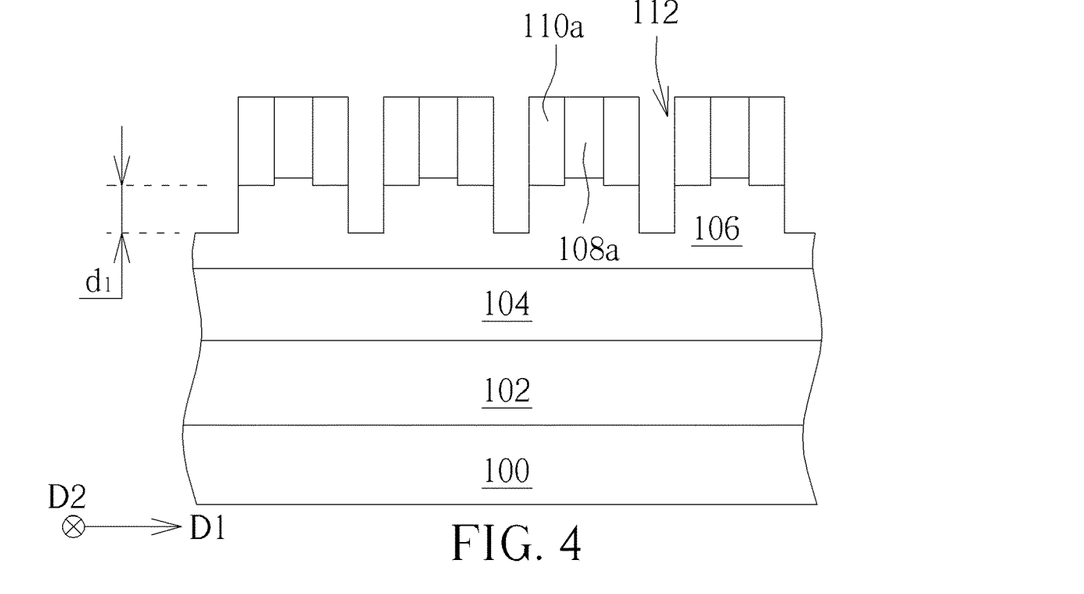

After the conformal spacer layer 110 is formed, as shown in FIG. 4, an anisotropic etch process is then performed to remove the layer structure on the surface by a certain vertical thickness, so that the spacer layer 110 is transformed into the spacer 110a at two sides of every mandrel 108a/108b. The advantage of this manufacturing method is that the spacer 110a is self-alignedly formed at both sides of every mandrel 108a/108b, namely self-aligned double patterning (SADP) method.

In addition to the spacer layer 110 with a certain thickness, the dielectric anti-reflection coating 108b in the mandrel 108a/108b is also completely removed in this step and only the organic dielectric layer 108a remains. Please note that since the vertical thickness of a removed layer structure in this etch process is larger than the thickness of spacer layer 110, the second hard mask layer 106 would still be influenced by the etch process after the spacer layer 110 thereon are completely removed, so that a portion of the second hard mask layer 106 is removed and the depth of first trench 112 is increased by about 75 Å-100 Å, as the depth d1 shown in FIG. 4. In this way, the thickness of second hard mask layer 106 on the non-mandrel region where the first trenches 112 locate would be significantly smaller than the thickness of second hard mask layer 106 on the mandrel region where the mandrels locate. The thickness difference of this hard mask layer on different regions is exactly the main cause of pattern loss in final dot patterns formed through following cross SADP process.

In order to solve this problem, the approach of present invention is to form a protection layer on the non-mandrel region to provide mask effect, and the thickness of second hard mask layer 106 on the mandrel region will be adjusted in later process to be the same as the thickness on the non-mandrel region in order to mitigate the micro-loading effect against the thickness. Detailed process steps will be described in following embodiment.

Figure 5:
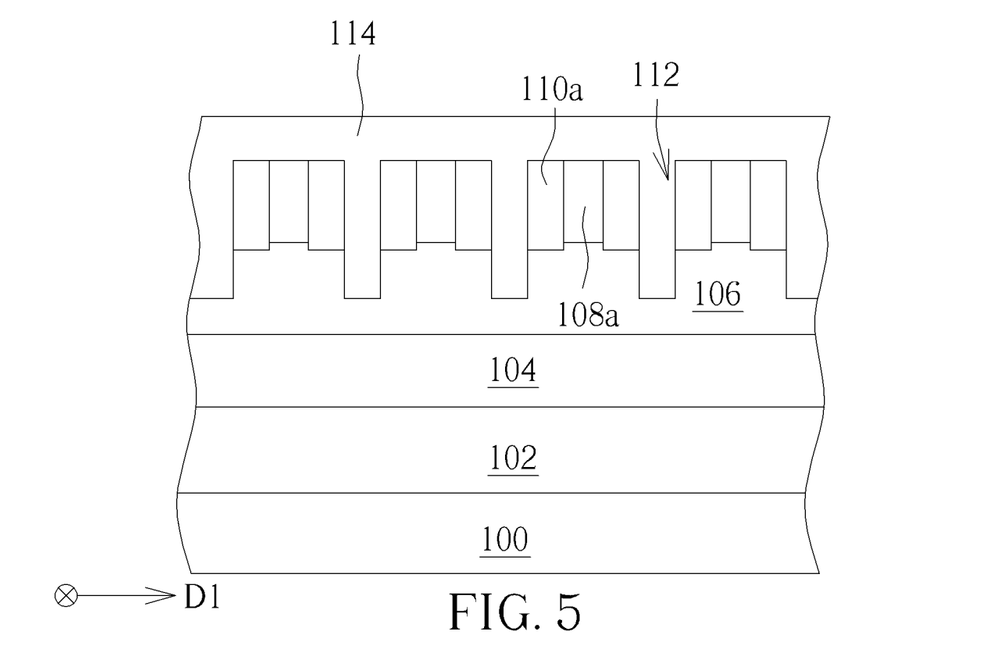

Please refer to FIG. 5. After the spacers 110a are formed, a protection layer 114, such as a spin-on-glass (SOG) coating, is blanketly-deposited on the entire surface. The protection layer 114 is filled into the first trench 112 between the spacers 110a, so that it may provide the efficacy in preventing the non-mandrel region from etch effect.

Figure 6:
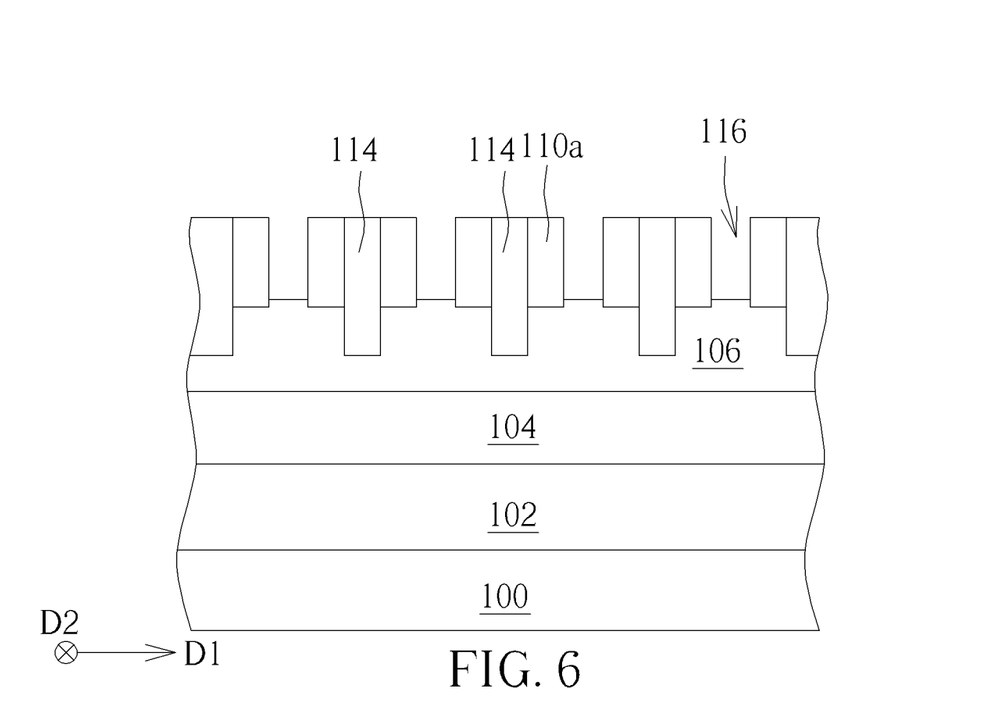

Please refer to FIG. 6. After the protection layer 114 is formed, an etch process is subsequently performed to remove the protection layer 114 outside the first trenches 112 and to remove the exposed mandrels (organic dielectric layer) 108a, so that second trenches 116 will be formed between the spacers 110a to expose thicker second hard mask layer 106 on the mandrel region, while thinner second hard mask layer 106 on the non-mandrel region is masked and protected by the protection layer 114.

Figure 7:
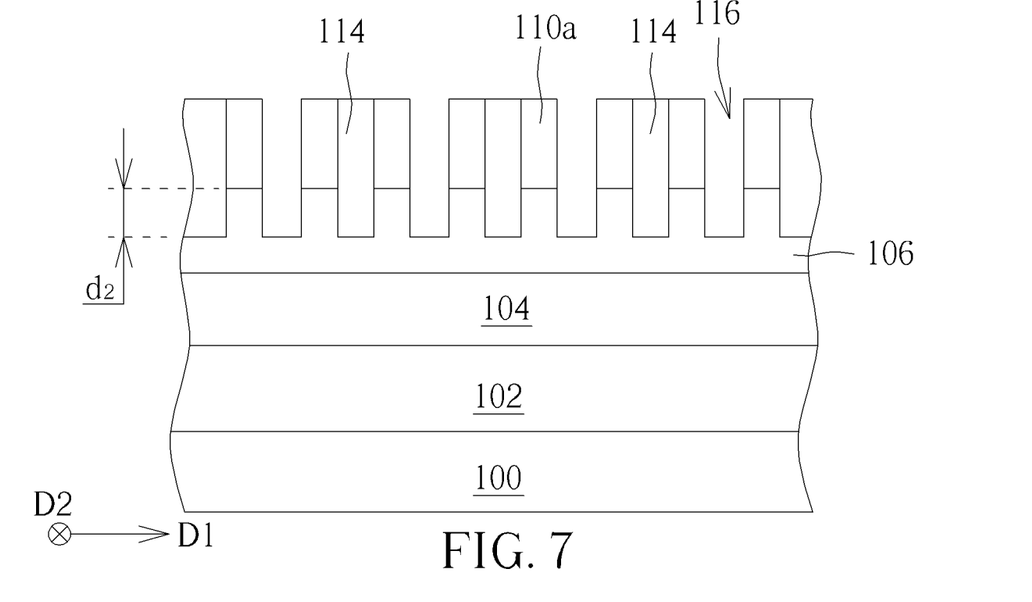

Please refer to FIG. 7. After the second trenches 116 expose the hard mask layer 106 on the mandrel region, an anisotropic etch process is then performed to remove a portion of exposed second hard mask layer 106 to increase the depth of second trenches 116, as the depth d2 shown in FIG. 7. In the embodiment of the present invention, this etch step would remove a portion of the second hard mask layer 106 on the mandrel region until its surface is flush with the surface of second hard mask layer 106 on the non-mandrel region (under the protection layer 114). The purpose of this step is to provide the same thickness of second hard mask layers 106 on the mandrel region and the non-mandrel region, so that the micro-loading effect and pattern loss problem that may be caused by the non-uniform thickness in a following process may be prevented.

Figure 8:
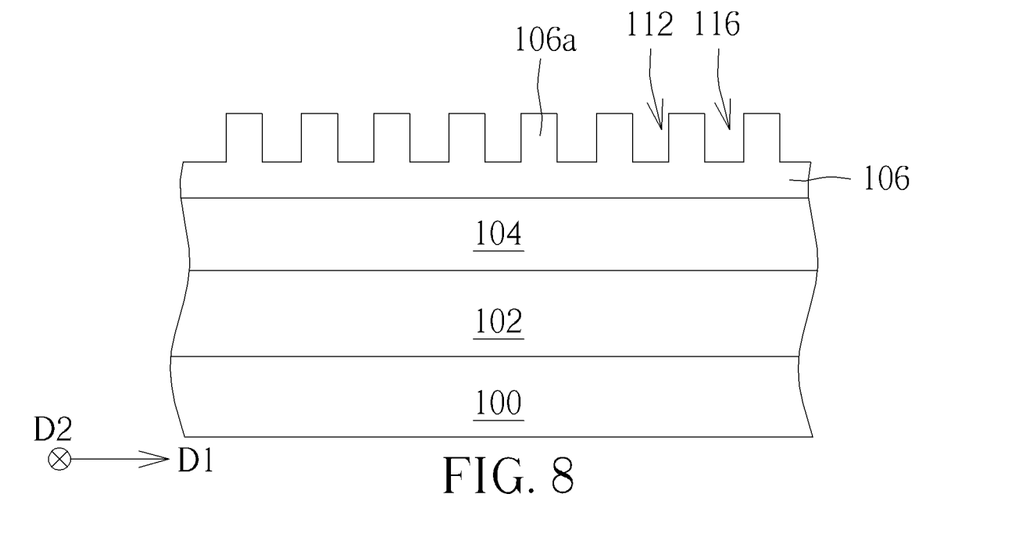

Please refer to FIG. 8. After having the same thickness of second hard mask layer 106 on the mandrel region and the non-mandrel region, a wet etch process is then performed to completely remove the silicon oxide based protection layer 114 and spacers 110a. Only the silicon nitride based second hard mask layer 106 remains in the process. In this way, it may be seen in the figure that protruding portions 106a of the second hard mask layer are formed between the mandrel region and the non-mandrel region. This kind of second hard mask layer 106 is desired and ideal hard mask for the present invention, which features the protruding portions 106a with multiple line patterns formed by double patterning and preferably extending in the second direction D2 perpendicular to the first direction D1. It will serve as an etch mask in a following etch process to etch the underlying first hard mask layer 102 with multiple line patterns extending in the first direction D1, thereby achieving the efficacy of cross SADP in the present invention. On the other hand, the bottom surfaces of first trench (non-mandrel region) 112 and the second trench (mandrel region) 116 formed in a previous process would have even level to prevent the micro-loading effect that may be caused by the non-uniform thickness in later process.

Figure 9:
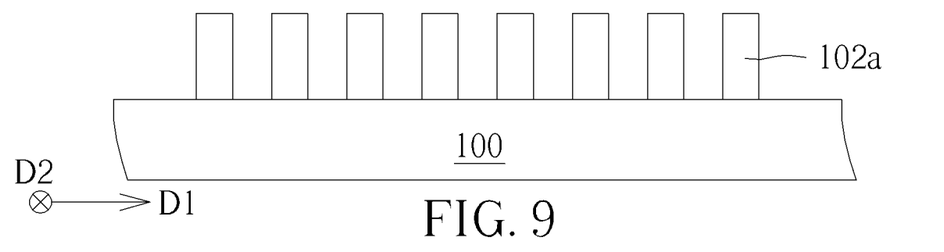
Figure 11:
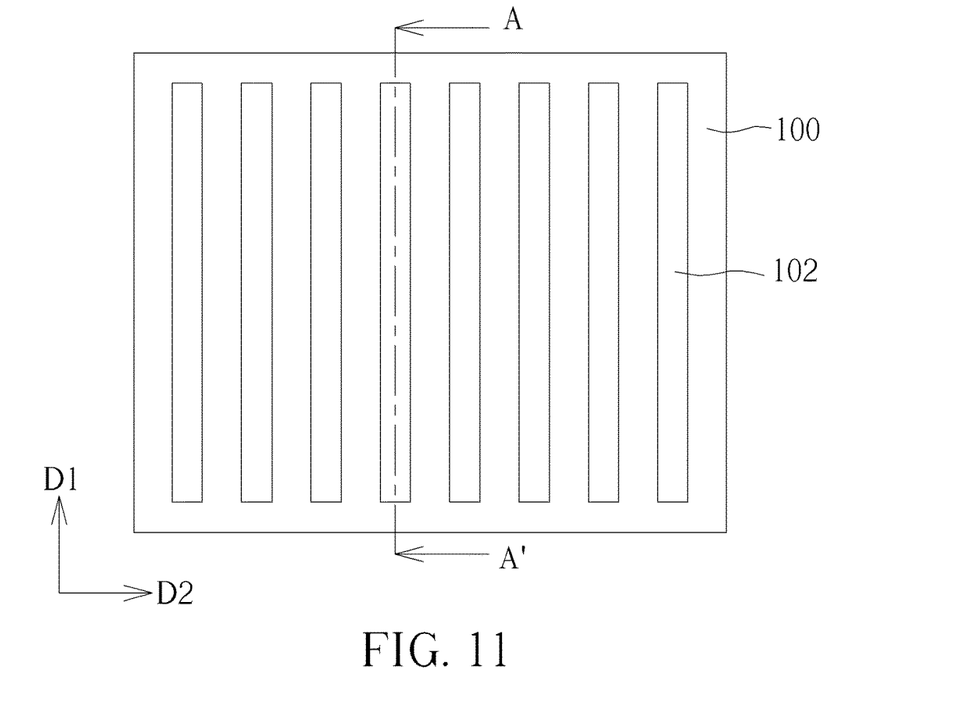
FIG. 11 and FIG. 12 are schematic top views illustrating the hard mask patterns before and after the method of cross self-aligned double patterning, respectively, in accordance with an embodiment of the present invention.
Figure 12:
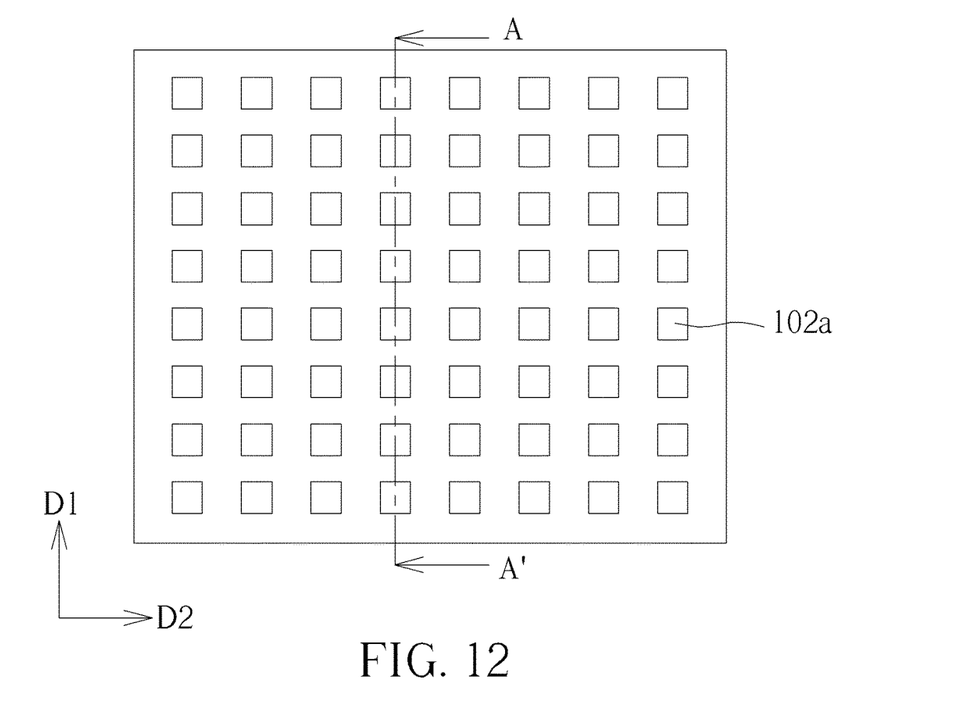

Finally, please refer to FIG. 9. Another anisotropic etch process is performed using the second hard mask layer 106 as an etch mask to etch the underlying flat layer 104 and the first hard mask layer 102, thereby transferring the line patterns of second hard mask layer 106 to the first hard mask layer 102 and forming the final patterns 102a. As shown in FIG. 11, the line patterns of first hard mask layer 102 extending in the first direction D1 would be etched once again in this etch step, so that the remaining portion of first hard mask layer 102 would be an overlapping pattern of the first hard mask layer 102 and the second hard mask layer 106. This is exactly the dot pattern 102a arranged in an array form shown in FIG. 11, and it is also the pattern of storage node contact pads that we want to define in the manufacture of memory devices.

After the above-mentioned first hard mask layer with dot patterns is completed, the following process is to transfer these dot patterns 102a to the underlying etch target layer 100 and further underlying material layer for the contact pads. Since the following process of manufacturing the memory devices are complicated and not the key features of present invention, detailed description about these following processes will not be provided herein in case of obscuring the focus of present invention.

Figure 10:
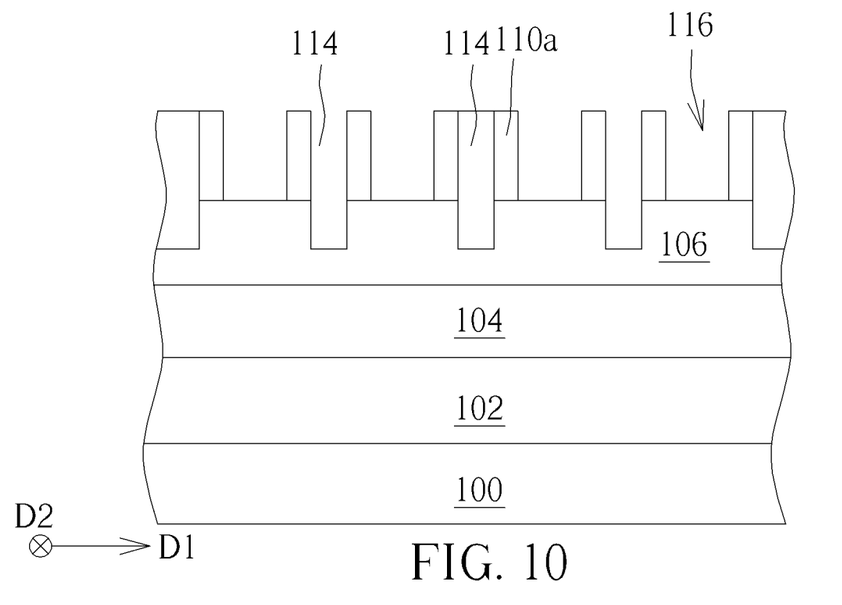
FIG. 10 is a schematic cross-section illustrating spacers after a trimming process in accordance with the embodiment of the present invention.

In another embodiment of the present invention, a trimming process, such as an isotropic etch process, may be optionally performed to the spacers 110a after the step of removing the mandrels and forming the second trenches 116, as shown in FIG. 10. The spacer 110a would be trimmed in this process to adjust its thickness and the width of second trench 116. This trimming process may be integrated in advanced process control system to compensate the pitch walking problem caused by mask misalignment or critical dimension (CD) bias.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of self-aligned double patterning, comprising:
providing a substrate, wherein a hard mask layer formed on said substrate;
forming multiple mandrels on said hard mask layer and forming spacers at two sides of each said mandrel, wherein said mandrels extend in a first direction and first trenches are formed between said spacers and extend into said hard mask layer by a vertical thickness;
forming a protection layer filling up said first trenches;
removing said mandrels to form second trenches exposing said hard mask layer between said spacers; and
performing a first anisotropic etch process using said spacers and said protection layer as an etch mask to remove a portion of said hard mask layer exposed from said second trenches.

2. The method of self-aligned double patterning of claim 1, wherein said first anisotropic etch process removes a portion of said hard mask layer exposed from said second trenches, so that a thickness of said hard mask layer exposed from said second trenches equals to a thickness of said hard mask layer under said protection layer.

3. The method of self-aligned double patterning of claim 1, wherein the steps of forming said spacers comprises:
forming a conformal spacer layer on said mandrels and said hard mask layer; and
performing a second anisotropic etch process to said spacer layer, so that said spacer layer self-alignedly transforms into said spacers at two sides of each said mandrel and forming said first trenches exposing said hard mask layer between said spacers, wherein said second anisotropic etch process concurrently remove a portion of said hard mask layer exposed from said first trenches, so that said first trenches extend into said hard mask layer by said vertical thickness.

4. The method of self-aligned double patterning of claim 1, further comprising removing said protection layer and said spacers after said first anisotropic etch process to expose entire said hard mask layer, wherein said hard mask layer is provided with multiple protruding line patterns spaced apart from each other and extending in said first direction.

5. The method of self-aligned double patterning of claim 4, further comprising:
performing a preceding self-aligned double patterning process before forming said hard mask layer to form multiple preceding line patterns spaced apart from each other and extending in a second direction;
forming a dielectric layer and said hard mask layer on said preceding line patterns; and
performing a third anisotropic etch process to said hard mask layer after said protection layer and said spacers are removed to transfer said line patterns of said hard mask layer to said preceding line patterns under said line patterns, so that overlapped said line patterns and said preceding line patterns form multiple dot mask patterns arranged in an array on said substrate.

6. The method of self-aligned double patterning of claim 1, further comprising performing a trimming process after said mandrels are removed to trim and adjust a thickness of said spacers and a width of said second trenches.

7. The method of self-aligned double patterning of claim 1, wherein said mandrel comprises an organic dielectric layer and a dielectric anti-reflective coating, and said first anisotropic etch process concurrently and completely removes said anti-reflective coating of said mandrel.

* * * * *